United States Patent [19]

Souques et al.

[11] Patent Number: 4,473,810
[45] Date of Patent: Sep. 25, 1984

[54] DEVICE FOR MEASURING THE CURRENT WHICH FLOWS IN A CONDUCTOR

[75] Inventors: Georges Souques, Paris; Roland Cariou, Ivry; Robert Caudron, Meudon; Louis Fechant, Le Vesinet; Jean Le Guillerm, Le Pecq, all of France

[73] Assignee: La Telemecanique Electrique, France

[21] Appl. No.: 449,903

[22] Filed: Dec. 15, 1982

[30] Foreign Application Priority Data

Dec. 15, 1981 [FR] France .................................. 81 23379

[51] Int. Cl.³ ............................................ H01F 21/04
[52] U.S. Cl. .................................. 336/115; 336/84 M; 336/87; 336/124
[58] Field of Search .................... 336/84 R, 84 M, 87, 336/115, 116, 117, 118, 119, 124, 125

[56] References Cited

U.S. PATENT DOCUMENTS 2,880,400 3/1959 Tollefson ...................... 336/115 X
3,883,839 5/1975 Barrett et al. ...................... 336/116

FOREIGN PATENT DOCUMENTS 386161 12/1923 Fed. Rep. of Germany ...... 336/117

Primary Examiner—G. P. Tolin
Assistant Examiner—Susan Steward
Attorney, Agent, or Firm—William A. Drucker

[57] ABSTRACT

An a-c current sensor for measuring the current which flows in a conductor has an insulating frame having a central compartment open at its upper end and encompassed by a U-shaped receptacle for a bent portion of the conductor. A coil is housed in the central compartment. The frame is slidingly mounted within a sleeve made of a soft magnetic material and having two assembled half-shells. The voltage generated by the current across the coil is proportional to the intensity of current flow.

9 Claims, 15 Drawing Figures

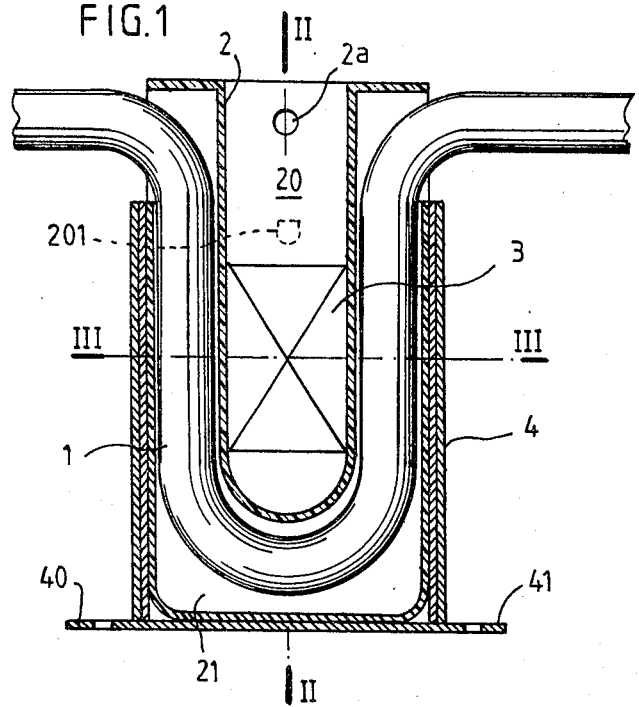
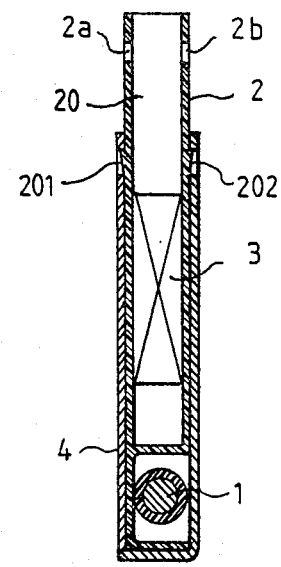
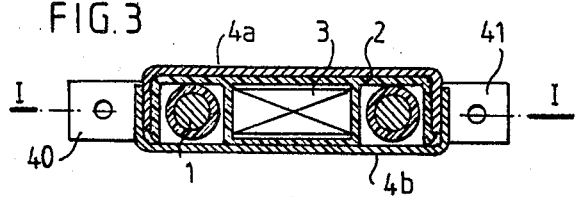
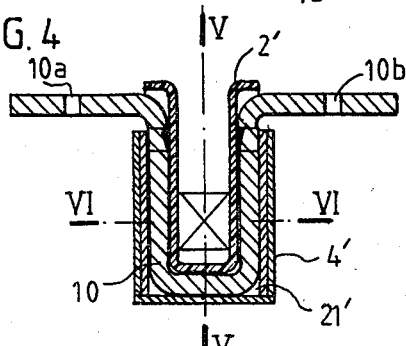
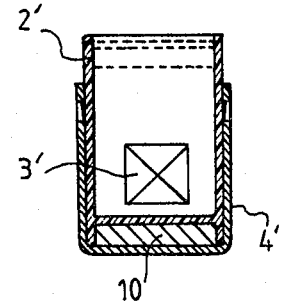
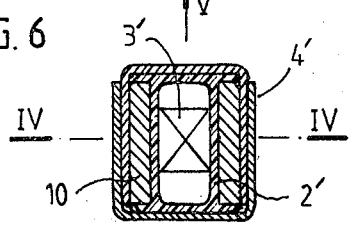

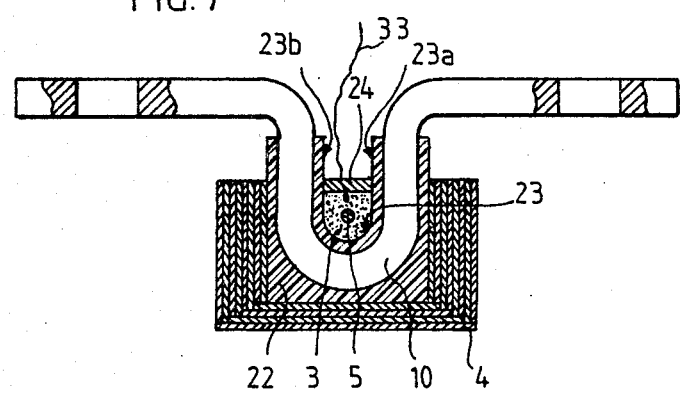
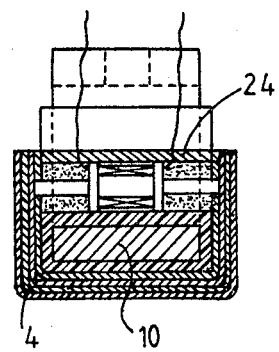
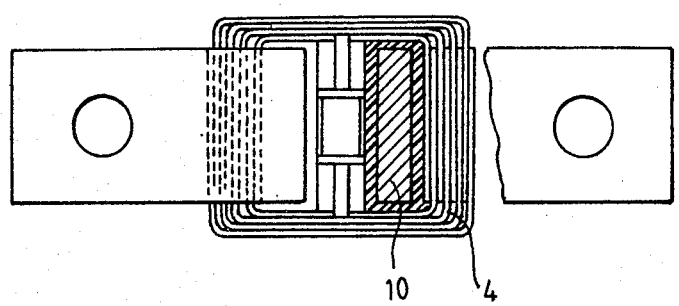
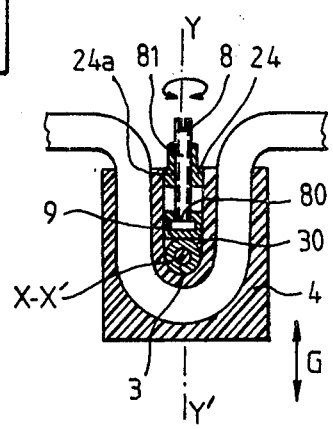
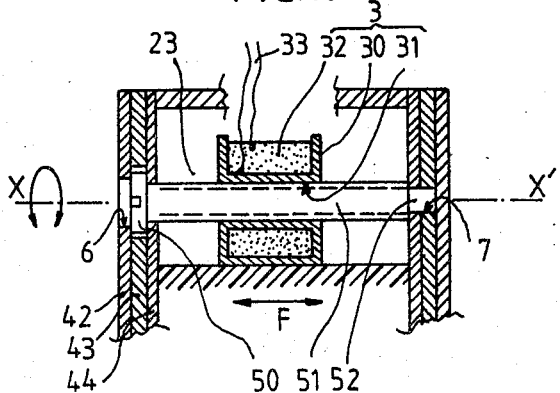
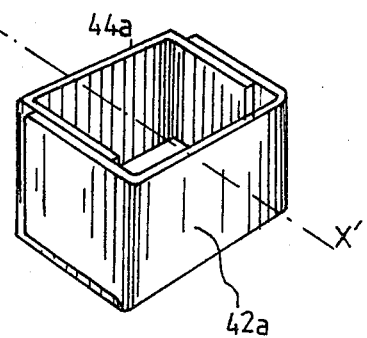

DEVICE FOR MEASURING THE CURRENT WHICH FLOWS IN A CONDUCTOR

BACKGROUND OF THE INVENTION

The invention relates to devices for measuring the current which flows in a conductor, in particular in industrial installations.

THE PRIOR ART

Different types of devices are known suitable for this purpose, for example, Hall effect sensors, in which the induction generated by the current to be measured is applied to a semi-conductor strip, through which flows a supplied current, and Rogowski loops sensors, comprising a coil wound on a non-ferro-magnetic core and surrounding the conductor through which flows the current to be measured.

Conventional Hall effect sensors can only measure small currents. For higher currents, it is necessar to neutralize the induction due to the current by a winding through which flows an antagonistic current, elaborated from the measurement by the Hall cell itself, which results in cumbersome and expensive device.

The Rogowski loop sensors present the disadvantage of being sensitive to the current flowing through adjacent conductors which may exist in an industrial installation, and screening thereof is very difficult to achieve.

OBJECT OF THE INVENTION

The present invention proposes overcoming these drawbacks and provides an a-c current sensor, simple in construction and easy to use, having good linearity and being practically insensitive to parasite currents.

SUMMARY OF THE INVENTION

The device of the invention comprises a coil placed in the vicinity of the conductor through which flows the current to be measured and is characterized by a sleeve or elongated case made from a ferro-magnetic material and by means for maintaining, in a defined position, inside said sleeve or case, a portion of said conductor bent in a U and, between the branches of the U, said coil.

According to a preferred embodiment, said holding means comprise a frame made of an insulating material defining a central compartment in which the coil is fixed, surrounded by a U-shaped receptacle, open on one face or on the sides for engagement of the conductor portion, said frame engaging by sliding into an elongated sleeve made from a ferro-magnetic material.

BRIEF DESCRIPTION OF THE DRAWINGS

Other features, as well advantages of the invention, will be clearly understood from the following description.

In the accompanying drawing:

FIGS. 1 to 3 show a current sensor in accordance with a first embodiment of the invention, respectively in a section along I—I of FIG. 3, along II—II of FIG. 1 and along III—III of FIG. 1;

FIGS. 4 to 6 show a variation, respectively in section along IV—IV of FIG. 6, along V—V of FIG. 4 and along VI—VI of FIG. 1.

FIGS. 7 to 10 illustrate one embodiment in which a composite screening is provided and a screw for adjusting the induction;

FIGS. 11 and 12 illustrate a variation, in which the screw for adjusting the induction is perpendicular to the axis of the coil;

The same reference numbers designate similar parts in the different figures.

DESCRIPTION OF THE PREFERRED EMBODIMENT

Figure 13:
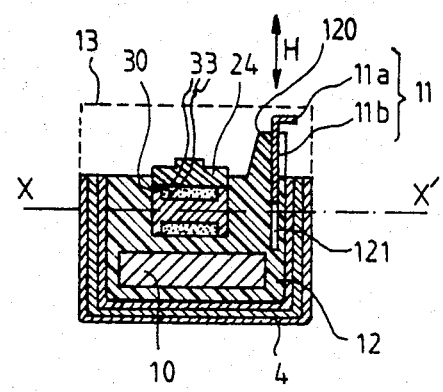
FIGS. 13 and 14 illustrate another embodiment, in which the induction is adjusted by pressing in a magnetic wedge.

In FIGS. 1 to 3 there is shown a flexible insulated cylindrical conductor 1 with, for example, a section of 16 mm$^2$, through which passes the current to be measured, of an intensity of 50 amps, for example. This conductor is bent in the form of a U, having, for example, a depth double its width. The U is held in shape by an engagement in an insulating material frame 2 defining a central compartment 20 open at its upper part and having a rounded bottom, surrounded by a receptacle 21 in the shape of a U whose front face is open so as to allow introduction therein of the bent portion of the conductor. Inside the central compartment 20 is fixed a coil 3 whose connecting wires come out through two orifices 2a–2b formed in the principle walls of said compartment.

Frame 2 is introduced by sliding into a soft magnetic material sleeve 4 obtained by assembling together two half-shells fitted one into the other (4a–4b, FIG. 3). This sleeve is open at its upper end, and provided at its based with fixing lugs 40–41.

The main walls of compartment 20 are provided with studs 201–202 which are engaged with recesses provided in the corresponding walls of the sleeve and provide locking of the assembly.

The wires of the coil are connected to an operational amplifier, not shown, connected as an integrator.

In operation, the current which flows in conductor 1 induces in the coil a magnetic field, whose induction, strictly proportional to the current, gives rise therein to a voltage proportional to the drift of the current. The integrator finally supplies a signal proportional to the current to be measured. Since the position of the coil with respect to the conductor is strictly determined in this device, the factor of proportionality is constant. Furthermore, because of the use of a coil, it is independent of the temperature and the current may have any frequency.

It will be noted that the coil may comprise a number of turns which is all the higher the smaller the current to be measured. Insofar as high currents are concerned, with the conductor bent in a U shape and the magnetic field thus surrounding two conductor positions through which pass opposite currents, it is not easily saturated and consequently continues to play its screening role. It will, however, be noted that considering the magnetic leaks and the permeability of the iron which will generally form the sleeve, this latter will be the seat of a maximum residual induction at mid-height and be zero in the plane of symmetry of the U. It is therefore advantageous for the width of the U not to exceed a certain limit, which depends on the current to be measured.

The extent of the measuring range is finally limited only by the section of conductor 1.

The device may serve for measuring the current, for example, in a switching device placed in an individual installation and, consequently, in the presence of currents flowing through adjacent conductors. In fact, the screening makes it not very sensitive to such currents, or more generally, to parasite magnetic masses.

In the variation illustrated in FIGS. 4 and 6, the device is delivered to the user with an incorporated uninsulated conductor element 10, provided with holes 10a–10b for direct connection with the terminals of the switching apparatus in which flows the current to be measured.

As can be seen in FIGS. 5 and 6, this conductor element is in the form of a bar, having for example a section 20×3 mm for a current of 200 amps and the frame 2' comprises a central compartment inside which is placed coil 3', surrounded by receptacle 21' shaped as a U, open at its front face as in the embodiment of FIGS. 1 to 3. The mgnetic material sleeve 4' has here a substantially square cross-section.

FIGS. 7 to 10 illustrate a modified embodiment of the screen and provide mechanical means for adjusting the induction.

In the embodiment shown in FIGS. 7 to 10, sleeve 4 is formed in two thicknesses, 42–44, stamped, welded or bent. These thicknesses are insulated from each other (layer 43). Outer layer 42 is formed from an ordinary ferromagnetic material, such as soft iron, whereas the inner layer 44 is formed from a very permeable material, such as "Mumetal".

For heavy currents (for example, I=400 amps), the layer of ordinary ferro-magnetic material will form a satisfactory screen. For low intensity currents, it is preferable to use a very permeable material, which reduces the linearity error. For intermediate currents, the very permeable layer risks being saturated during transitory surges (at 10 times the nominal current, for example), whereas the ordinary ferro-magnetic layer risks letting through disturbances, which are too great, caused by conductors through which flows a high current and being located in the vicinity of the sensor. The combination of two or more layers of different permeabilities provides in the end a satisfactory screen over a large measuring range and with excellent insensitivity to disturbances.

A non-magnetic screw 5 comprises: a head 50 nipped between the two layers 40 and 42 so as to hold it axially and so as to be accessible from the outside through an orifice 6; a threaded rod 51 whose axis XX' coincides with that of coil 3; and a centering stud 52 disposed in a bearing 7 in the opposite face of sleeve 4.

Coil 3 comprises a carcass 30 having a threaded opening 31 which cooperates with rod 51 and a winding 32 having output wires 33. Operation of the screw 5 moves the coil in the direction of arrow F, which allows mechanical adjustment of the sensor, so calibrating of the apparatus.

The insulating frame is formed, in the embodiment described, by receptacle 22 molded over conductor 10 and by a coil housing 23 having parallel walls 23a–23b which guide the carcass so as to prevent it from rotating. This housing is closed by cover 24.

In the embodiment shown in FIGS. 11 and 12 and which will be suitable to currents of 160 milliamps, for example, the sleeve 4 is formed from two U-shaped pieces, 44a and 42a, fitting into one another in reverse directions and formed respectively from "Mumetal" and soft iron. The adjacent wings of these pieces are parallel to the axis XX' of the coil and are disposed symmetrically with respect to this axis.

The overlapping regions of these wings, where the thickness of the screening is increased, so the phenomenon of saturation pushed back, are precisely situated, in respect to conductor 10, in zones where the induction is particularly high.

The adjustment of the position of coil 3, whose carcass 30 is contained in an insulating housing 23, is effected by means of a screw 8 comprising a head 80 and threaded rod 81 with axis YY' perpendicular to XX'. This rod passes through a cover 24 which closes housing 23 and which is provided with a threaded hole 24a. Head 80 is held in a housing 9. Rotation thereof causes movement of the coil in the direction of arrow G.

Figure 14:
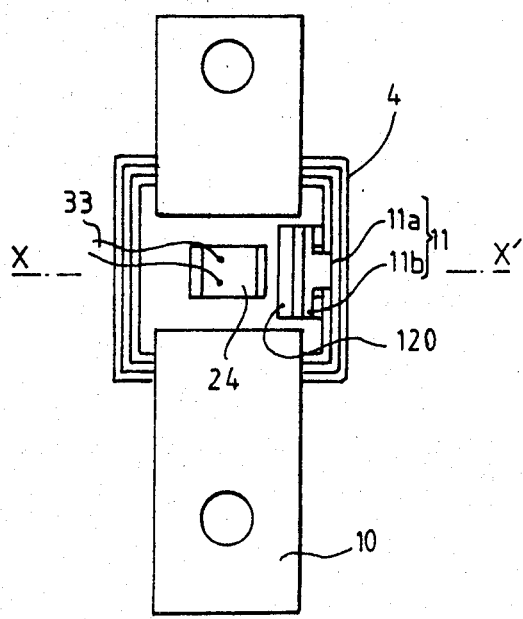

In FIGS. 13 and 14, there is shown a variation of the device of FIGS. 7 and 9, in which the adjusting screw is replaced by a magnetic wedge 11 which is moved, by means of an operating stud 11a, in a guide groove 121 formed in the receptacle 12 in which is embedded the carcass 30 of the coil, covered with a cover 24. The receptacle 12 comprises a raised part 120 which serves for holding and guiding the wedge 11.

For calibrating the apparatus, wedge 11 is pressed more or less in the direction of arrow H: it insulates to a greater or lesser degree the screening from the coil 4. After calibration, wedge 11 may be secured by being over-molding with an additional material 13 which covers it.

Figure 15:
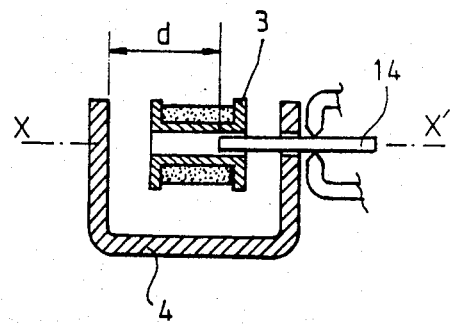
FIG. 15 shows schematically the use of a plunger core for adjusting the induction.

In FIG. 15 there is shown schematically a small magnetic core 14 which presses through an orifice provided in the wall of the screening 4 and penetrates to a greater or lesser degree inside coil 3. After adjustment of the air gap d, the core is cut outside the screening. This arrangement provides good linearity of the output signal providing that d is relatively high, so as to avoid the saturation which is likely to appear when the currents to be monitored are very high.

It goes without saying that different modifications and variations of the devices described may be imagined by a man skilled in the art.

We claim:

1. A U-shaped conductor portion having two legs and a device for converting a current flowing through said conductor portion into an output voltage proportional to said current, said device comprising:
   a box-like insulating frame having a U-shaped receptacle with two legs open at one end and a central compartment located between the legs of the U-shaped receptacle, said central compartment having walls provided with two orifices, the said U-shaped conductor portion being closely fitted within said receptacle with the respective legs of the said conductor portion passing through the open ends of the respective ends of the respective legs of the said receptacle;
   a coil secured within the central compartment, said coil having two output terminals respectively passing through the respective orifices of the central compartment; and
   box-like screen means made of a ferro-magnetic material, said screen means partially encompassing said insulating frame.

2. A U-shaped conductor portion and device as claimed in claim 1, wherein the said conductor portion is permanently secured within the said receptacle.

3. A U-shaped conductor portion and device as claimed in claim 1, wherein the said screen means comprise at least inner and outer ferro-magnetic layers with an insulating layer therebetween, the ferro-magnetic material of the inner layer having a substantially higher magnetic permeability than that of the outer layer.

4. A U-shaped conductor portion and device as claimed in claim 3, wherein the inner and outer layers each have the shape of a U with the legs of the U-shaped inner layer having outer faces and the legs of the U-shaped outer layer having inner faces, the U-shaped inner and outer layers being mutually inverted and having a common axis of symmetry which is also an axis of symmetry for the coil.

5. A U-shaped conductor portion and device as claimed in claim 1, said device further comprising means for adjusting the induction of the coil.

6. A U-shaped conductor portion and device as claimed in claim 5, wherein the said adjusting means comprise non-magnetic screw means for adjusting the position of the coil by displacing the said coil in a direction parallel to the axis thereof.

7. A U-shaped conductor portion and device as claimed in claim 5, wherein the said adjusting means comprise non-magnetic screw means for adjusting the position of the coil by displacing the said coil in a direction perpendicular to the axis thereof.

8. A U-shaped conductor portion and device as claimed in claim 5, wherein the receptacle has a wall portion extending out of the screen and a guide groove provided in said wall portion and the said adjusting means comprise magnetic shield means adjustably engaged in said guide groove.

9. A U-shaped conductor portion and device as claimed in claim 5, wherein said adjusting means comprise a magnetic core and an orifice in one wall of the said screen means, said core passing through said orifice and being adjustably engaged inside the coil.

* * * * *